US009558304B2

United States Patent
Yamamoto et al.

(10) Patent No.: US 9,558,304 B2
(45) Date of Patent: Jan. 31, 2017

(54) SUBSTRATE PROCESSING APPARATUS, SIMULATION APPARATUS, STORAGE MEDIUM AND SIMULATION METHOD

(71) Applicant: TOKYO ELECTRON LIMITED, Tokyo (JP)

(72) Inventors: Satoko Yamamoto, Sapporo (JP); Kimitoshi Miura, Yokohama (JP)

(73) Assignee: TOYKO ELECTRON LIMITED, Tokyo (JP)

( * ) Notice: Subject to any disclaimer, the term of this patent is extended or adjusted under 35 U.S.C. 154(b) by 419 days.

(21) Appl. No.: 14/180,768

(22) Filed: Feb. 14, 2014

(65) Prior Publication Data

US 2014/0236556 A1    Aug. 21, 2014

(30) Foreign Application Priority Data

Feb. 15, 2013    (JP) .................. 2013-027563

(51) Int. Cl.
   *G06G 7/50*    (2006.01)
   *G06F 17/50*    (2006.01)
(52) U.S. Cl.
   CPC ................. *G06F 17/5009* (2013.01)
(58) Field of Classification Search
   CPC .................................................. G06F 17/5009
   See application file for complete search history.

(56) References Cited

U.S. PATENT DOCUMENTS 7,128,578 B2 * 10/2006 Lampotang ............ G09B 23/30
128/204.23
2006/0224265 A1 * 10/2006 Nakayama ........ H01L 21/67201
700/108

(Continued)

FOREIGN PATENT DOCUMENTS

| JP | 6-187581 A | 7/1994 |
| JP | 2008-129913 A | 6/2008 |
| JP | 2010-102693 A | 6/2010 |

OTHER PUBLICATIONS

John Quarles et al., "Scaffolded learning with mixed reality," 2009, Computers & Graphics, vol. 33, pp. 34-46.*

(Continued)

*Primary Examiner* — Aniss Chad
*Assistant Examiner* — Russ Guill
(74) *Attorney, Agent, or Firm* — Nath, Goldberg & Meyer; Jerald L. Meyer

(57) ABSTRACT

A substrate processing apparatus includes a substrate processing apparatus, including: a substrate processing chamber configured to accommodate a substrate and process the substrate; a piping coupled to the substrate processing chamber to allow a gas for processing the substrate to be introduced therethrough; and a simulation apparatus configured to simulate a path in which the gas for processing the substrate flows through the piping. The simulation apparatus includes: an information acquisition unit configured to acquire gas flow information defined by an operation mode in which the substrate is processed; a path determination unit configured to determine a gas path based on the gas flow information acquired by the information acquisition unit; and a simulation unit configured to simulate a flow of the gas by putting a color defined according to the type of gas on the gas path determined by the path determination unit.

11 Claims, 8 Drawing Sheets

(56) References Cited

U.S. PATENT DOCUMENTS

2007/0174760 A1\* 7/2007 Chamberlain ........ G06F 17/246
            715/220
2010/0078128 A1\* 4/2010 Yamada ................ C23C 16/455
            156/345.26
2013/0288400 A1\* 10/2013 Graff ..................... H01L 21/266
            438/14

OTHER PUBLICATIONS

Kian, "Simulating fluid flow through pipes," 2011, http://www.gamedev.net/topic/604126-simulating-fluid-flow-through-pipes/, six pages.\*

Peter Hall, "Simulating and animating fluid flow through a network of tubes," 1994, Victoria University of Wellington, pp. 1-25.\*

\* cited by examiner

| Classification of Danger and Harmfulness (Color of valve and pipe) | Oxygen Gas | Hydrogen Gas | Inert Gas | Liquefied Chlorine | Mixed/Contacted Gas |
|---|---|---|---|---|---|
| | Oxidizing, Others | Flammable, Toxic | Inert ($N_2$) | Corrosive, Toxic | Mixed/Contacted State, Vacuum State |
| Indication at ON state — Color | Blue | Pink | Green | Yellow | Amber |
| Indication at ON state — RGB values | 17(0,160,255) | 61(255,160,255) | 2(0,255,0) | 0(255,255,0) | 58(255,160,0) |
| Priority of Gas | 2 | 3 | 1 | 3 | — |
| Chemical Formula of Each Material | $O_2$<br>Ar<br>NO<br>He<br>CO<br>$N_2O$<br>1% $O_2$/Ar<br>... | $H_2$<br>$Si_2H_6$<br>$H_2O$<br>$SiH_4$<br>0.8% $SiH_4$/He<br>20% $SiH_4$/He<br>50% $SiH_4$/He<br>... | Pure $N_2$<br>Pure $N_2$-1<br>Pure $N_2$-2<br>Pure $N_2$-3<br>$N_2$<br>$N_2$-1<br>$N_2$-2<br>... | $Cl_2$<br>HCl<br>$ClF_3$<br>$NH_3$<br>$SiH_2Cl_2$<br>$SiCl_4$<br>$SiHCl_3$<br>... | Mixed/Contacted gas State, Vacuum state |

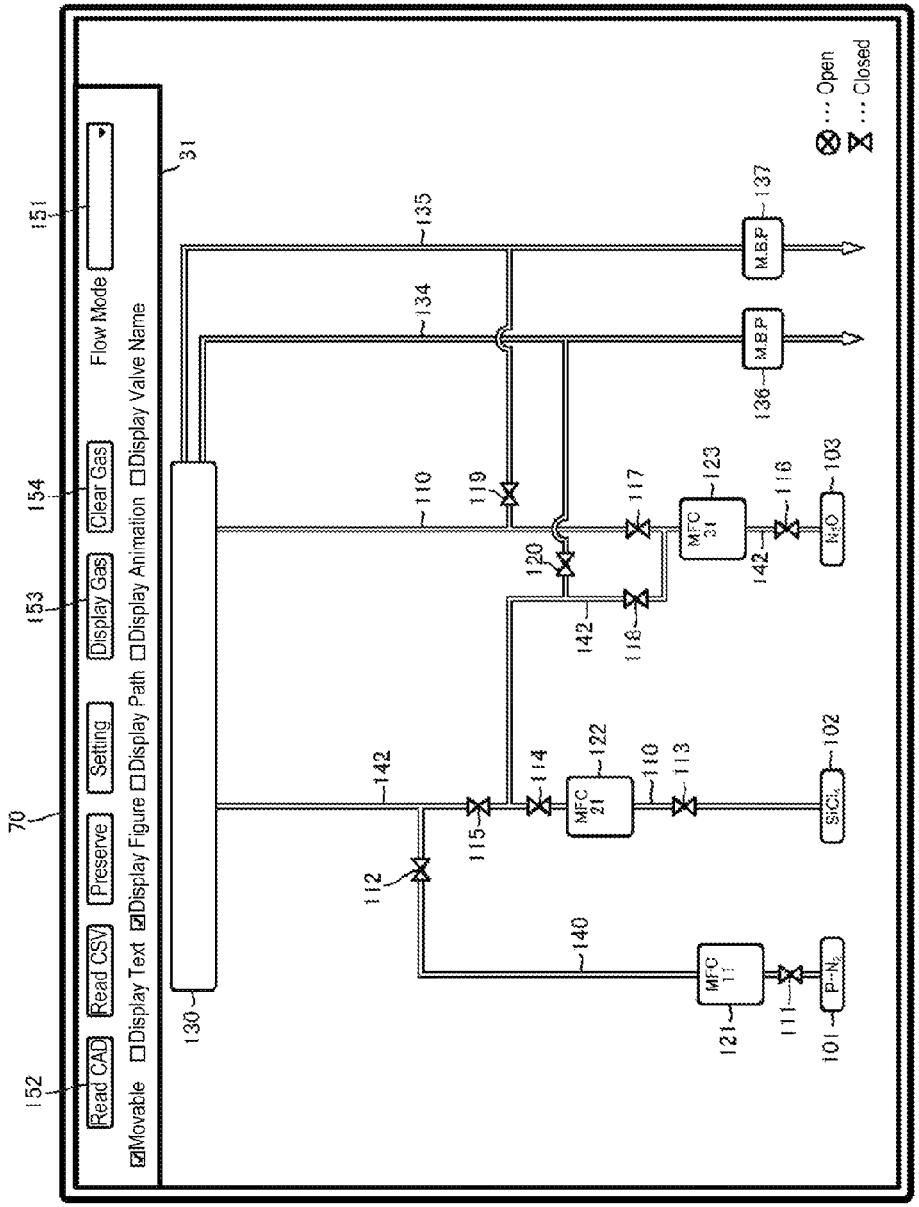

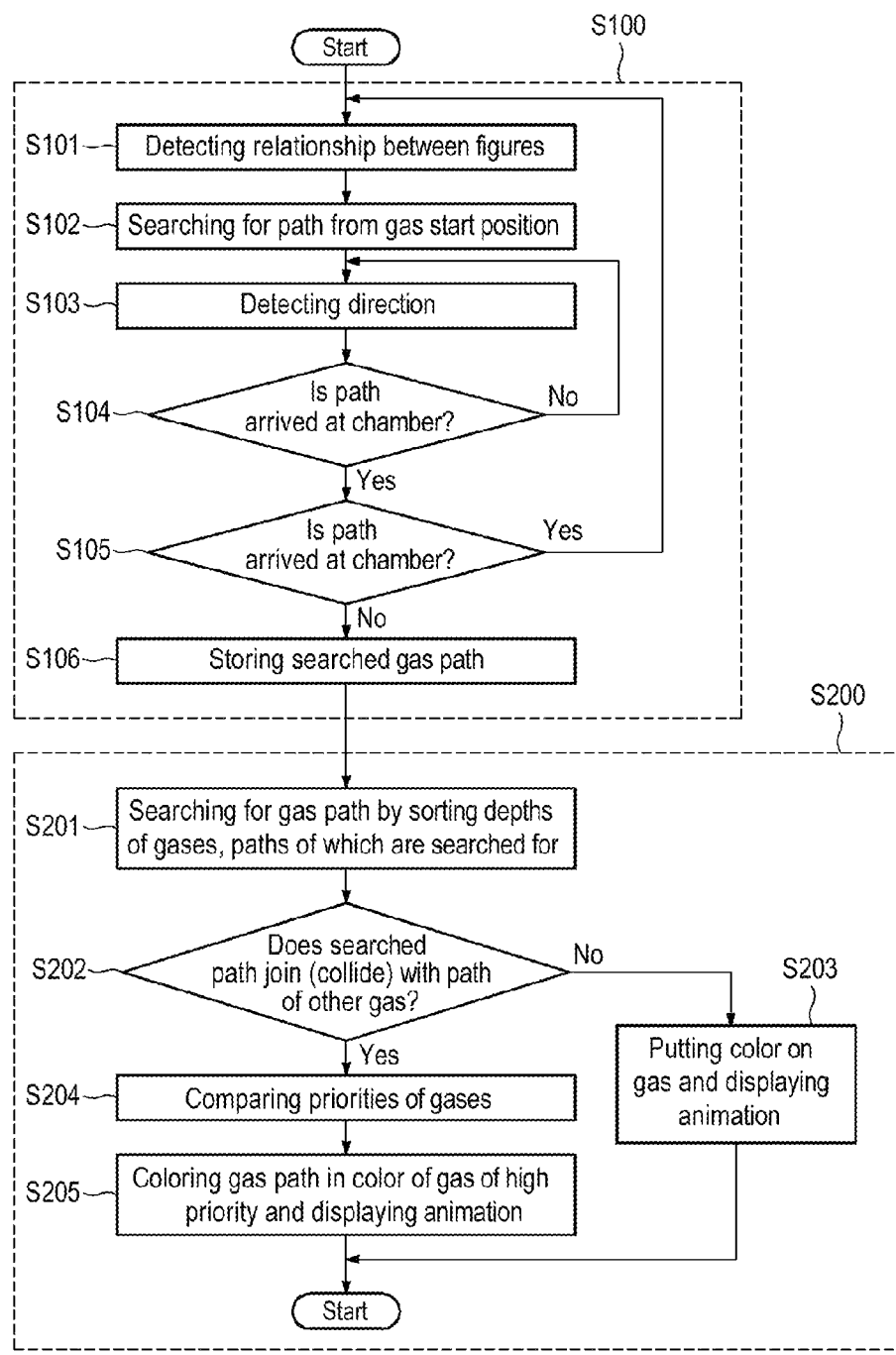

SUBSTRATE PROCESSING APPARATUS, SIMULATION APPARATUS, STORAGE MEDIUM AND SIMULATION METHOD

CROSS-REFERENCE TO RELATED APPLICATION

This application claims the benefit of Japanese Patent Application No. 2013-027563, filed on Feb. 15, 2013, in the Japan Patent Office, the disclosure of which is incorporated herein in its entirety by reference.

TECHNICAL FIELD

The present disclosure relates to a substrate processing apparatus, a simulation apparatus, a program and a simulation method.

BACKGROUND

In manufacturing a semiconductor, various kinds of gases are allowed to flow through a path formed by combining a plurality of pipes, in a process of, for example, performing heat processing on a substrate such as a semiconductor wafer or the like.

In designing this process, data including details of a process, i.e., a so-called procedure (hereinafter, referred to as a "recipe"), is prepared. For example, a gas flow diagram for flowing the gases is designed according to the recipe including paths, flow rates, and types of the gases which may be used in the process associated with the recipe. This recipe is generally prepared in the form of a table.

Since the recipe prepared in the form of a table is hard to read, a technique of simulating a state of a path for flowing gas by linking a gas piping design drawing (a CAD drawing) with the recipe has been devised recently.

In the conventional technique, a pipe, which is a gas path, is displayed only by being classified with a color. In this case, although a path or range in which a gas flows may be known, it may be difficult to accurately determine a direction of a gas flow or a way (state) of joining or mixing different types of gases. Thus, there is a problem in that it is difficult to determine whether or not a recipe provides a correct state of a gas flow diagram.

In addition, it is desired to simulate in real-time a state of a process operating in a substrate processing apparatus such as an actual semiconductor processing apparatus, as well as a simple simulation of the recipe.

SUMMARY

The present disclosure has been made to cope with the conventional situation. An object of the present disclosure is to provide a substrate processing apparatus, a simulation apparatus, a program and a simulation method, which can conduct a simulation for implementing in more detail a state of gas flow according to a recipe or a state of a currently operating process.

According to one embodiment of the present disclosure, provided is a substrate processing apparatus, including: a substrate processing chamber configured to accommodate a substrate and process the substrate; a piping coupled to the substrate processing chamber to allow a gas for processing the substrate to be introduced therethrough; and a simulation apparatus configured to simulate a path in which the gas for processing the substrate flows through the piping, wherein the simulation apparatus includes: an information acquisition unit configured to acquire gas flow information defined by an operation mode in which the substrate is processed; a path determination unit configured to determine a gas path based on the gas flow information acquired by the information acquisition unit; and a simulation unit configured to simulate a flow of the gas by putting a color defined according to the type of gas on the gas path determined by the path determination unit.

According to another embodiment of the present disclosure, provided is a simulation apparatus configured to simulate a path in which a gas for processing a substrate flows through a piping introduced into a processing chamber configured to process the substrate, the simulation apparatus including: an information acquisition unit configured to acquire gas flow information defined by an operation mode in which the substrate is processed; a path determination unit configured to determine a gas path based on the gas flow information acquired by the information acquisition unit; and a simulation unit configured to simulate a flow of the gas by putting a color on the gas path determined by the path determination unit, where the color is defined according to the type of gas.

According to another embodiment of the present disclosure, provided is a non-transitory computer readable storage medium for storing computer program adapted to cause a computer to execute a process of simulating a path in which a gas for processing a substrate flows through a piping introduced into a processing chamber configured to process the substrate, the process including: acquiring gas flow information defined by an operation mode in which the substrate is processed; determining a gas path based on the acquired gas flow information; and simulating a flow of the gas by putting a color defined according to the type of gas on the determined gas path.

According to another embodiment of the present disclosure, provided is a simulation method of simulating a path in which a gas for processing a substrate flows through a piping introduced into a substrate processing chamber configured to process the substrate, the method including: acquiring gas flow information defined by an operation mode in which the substrate is processed; determining a gas path based on the acquired gas flow information; and simulating a flow of the gas by putting a color defined according to the type of gas on the determined gas path.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a diagram showing an example of gas definition information.

FIG. 4 is a diagram showing an example of a simulation screen.

FIG. 5 is a flowchart illustrating the operation of searching for a gas path and displaying an animation.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
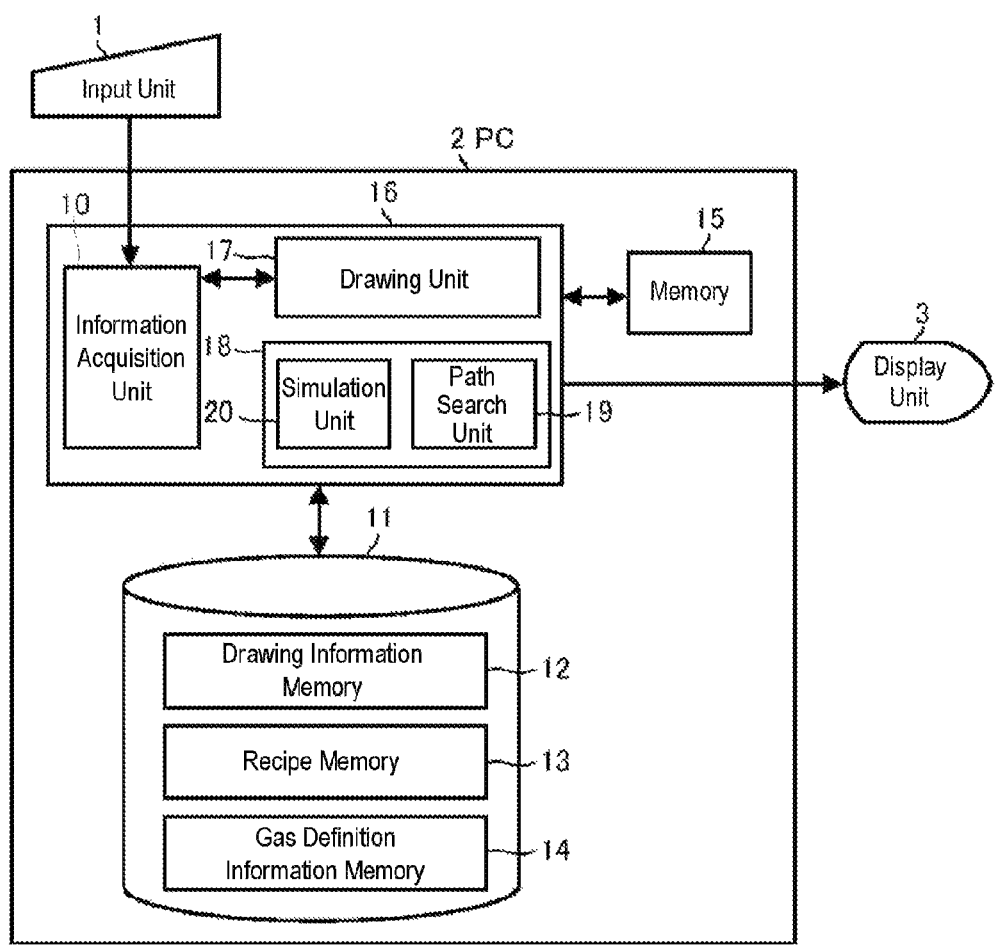
FIG. 1 is a diagram showing the configuration of a simulation system according to an embodiment of the present disclosure.

FIG. 1 is a view showing the configuration of a simulation system according to one embodiment of the present disclosure.

As shown in FIG. 1, a simulation system includes an input unit 1 as a user interface, such as a keyboard or a mouse, a computer 2 (hereinafter, referred to as "PC 2"), and a display unit 3 such as a display or a monitor.

The PC 2 is provided with a memory 15, a control unit 16 such as a CPU, and a database 11. The control unit 16 has an information acquisition unit 10, a drawing unit 17, and a display control unit 18, functions of which will be described below.

The drawing unit 17 is, for example, a CAD program or the like, displays a simulation screen 70 used for both drawing and simulation (see FIG. 4). Further, the drawing unit 17 may be used to draw a path diagram (CAD drawing) in which functional parts such as pipes, valves, mass flow controllers (hereinafter, referred to as "MFCs"), and a chamber configuring a path in which a gas flows are arranged. In some embodiment, a completed path diagram (CAD drawing) may be stored in a drawing information memory 12. In this case, the simulation system may access the drawing information memory 12 for the completed path diagram.

When the operation mode and a flow rate in a gas line is set by controlling the simulation screen 70, the information acquisition unit 10 acquires gas flow information including the type (class) of gas flowing into a pipe, an open/closed state of a valve installed in the pipe, and a flow rate of the gas from the recipe in the database 11 corresponding to the operation mode. If the input unit 1 is, for example, a keyboard or the like, a worker may directly input gas flow information for acquisition by the information acquisition unit 10.

The display control unit 18 has a path search unit 19 and a simulation unit 20. The path search unit 19 functions as a path determination unit which determines a gas path based on the gas flow information acquired by the information acquisition unit 10. If a "Display Gas" button 153 of the simulation screen 70 is pressed, the path search unit 19 searches for a path in which the gas flows by determining relationships among object parts (figures) of the CAD drawing displayed on the simulation screen 70, based on the gas flow information (the operation state of the device, the operation mode of the device, a flow rate of gas, the type of gas and the like of the recipe stored in a recipe memory 13) acquired by the information acquisition unit 10. That is, the path search unit 19 searches in the drawing for a path in which the gas flows based on the gas flow information (operation information of an MFC, opening/closing information of a valve, the class of gas and the like) acquired by the information acquisition unit 10.

The simulation unit 20 simulates a gas flow by coloring the gas flow according to the type of gas flowing through the gas path determined by the path search unit 19. That is, the simulation unit 20 colors the gas path searched by the path search unit 19 in a color associated with the type of the gas read from a gas definition information memory 14.

Specifically, the simulation unit 20 reads a color corresponding to the type of the gas from the gas definition information memory 14, colors the path searched by the path search unit 19 with the corresponding color. The simulation unit 20 also may display an animation by arranging a plurality of characters, for example, flickering gas beads or the like, along the gas path in order to show the gas flow.

That is, the simulation unit 20 puts a color defined by a gas of a high priority on a path of a joining section based on a priority set by the gas definition information memory 14. In addition, when different types of gases are joined, the simulation unit 20 puts a specific color on the path of the joining section.

The drawing information memory 12, the recipe memory 13, the gas definition information memory 14 and the like are installed in the database 11. The path diagram (CAD drawing) prepared by the drawing unit 17 is stored in the drawing information memory 12. Other than these, characters for displaying the colors and animations of respective gases defined in the gas definition information memory 14 are stored in the database 11. The characters are, for example, gas beads (flickering images of a circular shape designated by reference numerals 141, 143 and 145 of FIG. 6) or the like for representing a gas flow (a state of movement). Alternatively, the characters may be arrows, rotating shapes (a shape of sign poles) or the like.

Figure 2:
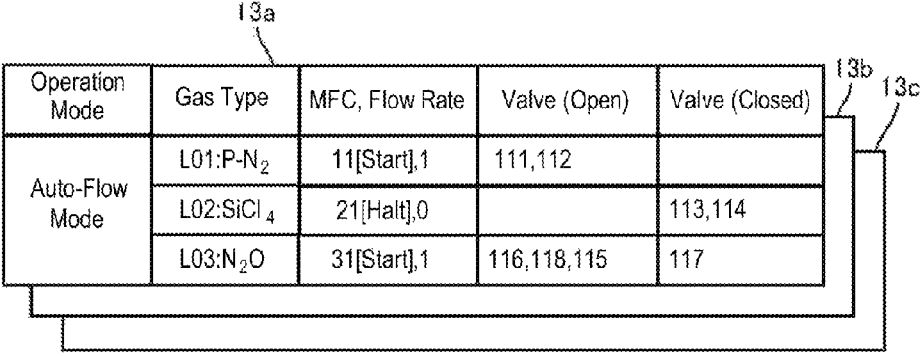
FIG. 2 is a diagram showing an example of a recipe.

As shown in FIG. 2, a recipe for processing a substrate by configuring a path for flowing a gas by starting and halting a device such as a valve or an MFC installed in the pipe and then flowing the gas into the path is stored in the recipe memory 13 for each operation mode. Based on the operation mode and a flow rate value of the MFC set for each gas line, a path for flowing the gas from a start point (a position starting the gas supply) to an end point (a chamber or the like) of the path corresponding to the operation mode and a state of the device (MFC or valve) on the path are determined The operation mode includes, for example, an auto-flow mode, a pre-flow mode, and a vacuum mode, which are different from one another in the type and path of a flowing gas, and a recipes 13a, 13b and 13c are respectively set for the operation modes. In this embodiment, an example of the auto-flow mode is shown at the forefront.

The auto-flow mode is a basic mode for flowing gas to a chamber 130 (see FIG. 4). The recipe 13a of the auto-flow mode is a recipe for operating a device to open valves on the paths (lines) of two types of gases flowing to the chamber 130 from a gas supply source if a value of flow rate other than 0 is set to the MFC.

The pre-flow mode is a mode for directly flowing gas into a line of an exhaust system. The recipe 13b of the pre-flow mode is a recipe for operating a device to valves on a gas path coupled to the exhaust system without actually flowing the gas into the chamber 130. In the vacuum mode, a flow rate cannot be specified, and a primary valve of the gas supply source is closed, and a secondary valve on a side of the chamber next to the MFC is opened.

As shown in this example, two types of gases such as Pure-N2 (hereinafter, referred to as "P-N2") and $N_2O$ are allowed to flow toward the chamber 130. Accordingly, the recipe 13a shows that valves 111, 112, 116, 118 and 115 are set to "open," and a valve 117 is set to "closed," and a MFC11 121 and a MFC31 123 are "operated" at a flow rate of "1."

In addition, since $SiCl_4$ gas is not allowed to flow during the auto-flow mode, it is shown in the recipe 13a that the valves 113 and 114 are "closed" and the MFC21 122 is "halted" at a flow rate of "0."

That is, the gas flow information (the type of gas operation information of a MFC for forming a path for flowing a gas (start/halt of the MFC, a flow rate of "1" or "0," and the like), and opening/closing information of a valve in each pipe, and the like) defined by the operation for processing a substrate is stored in the recipe memory 13.

In other words, the gas flow information showing paths of gases defined by the operation mode for processing a substrate may be stored in the recipe memory 13.

As shown in FIG. 3, the gas definition information memory 14 also stores information for each type of gas such as a classification of danger and harmfulness, an indication color, a priority, a name, a chemical formula corresponding to each type of gas. For example, a priority according to the type of gas is set in the gas definition information memory 14. In addition, specific colors displayed when different types of gases are joined and colors displayed for respective types of gases are defined in the gas definition information memory 14.

In one embodiment, the gases may include P-N2, $N_2O$, $SiCl_4$, gases that are accidently mixed and/or contact each other, and the like. In this case, the P-N2 is defined such that the classification of danger and harmfulness is "inert gas," the indication color is "green," the priority is "1," and the chemical formula is "Pure-N2."

In addition, the $N_2O$ is defined such that the classification of danger and harmfulness is "oxygen gas," the indication color is "blue," the priority is "2," and the chemical formula is "$N_2O$." Here, a higher value of the gas priority means that the gas is more dangerous and harmful. Designated values of a color (RGB values) in a computer are set for the indication color.

Gases are marked with a specific color only at a joining section of the gas path when the gasses are accidentally mixed and contacted in a vacuum state, or when the accidentally mixed and contacted gases at the joining section of the gas path generate a hazardous situation. In this case, such mixture of gas may be set in the color of amber or the like. A combination of gases generating a hazardous situation such as explosion or the like when, for example, an "oxidizing gas" and a "flammable gas" are combined. Specifically, it is dangerous to combine oxygen gas and hydrogen gas, chlorine gas and hydrogen gas, or the like. As described above, according to the recipe, it is possible to generate a gas flow path in which a combination of gases at a joining point of the gas path generates a hazardous situation may be set by mistake. However, such situation can be easily and visually identified, since a path (line) is colored in amber if it includes a dangerous combination of the gases when they may accidently be mixed and/or contact each other.

That is, forbidden combinations of gas types and colors corresponding to the forbidden combinations are set in the gas definition information memory 14. If gases of a forbidden combination are joined in a section, the simulation unit 20 reads a corresponding color (e.g., a specific color such as amber) with reference to the gas definition information memory 14 and puts a color (e.g., amber) different from a color defined for each gas on the path of the joining section.

Next, the operation of the simulation system of a first embodiment will be described with reference to FIGS. 4 to 6.

In the first embodiment, the drawing unit 17 forms (draws) a gas path by displaying the simulation screen 70 used for both drawing and simulation (see FIG. 4) on the display unit 3 and arranging respective units by the handling of a user.

Also, in a case where there is a completed CAD drawing, the drawing unit 17 reads the CAD drawing previously stored in the memory 15 or the like and displays the CAD drawing on the simulation screen 70, by pressing (selection or click handling) a "Read CAD" button 152, which is a button for reading the CAD drawing.

A "Setting" button, a "Preserve" button and the like are used for drawing and provided in the simulation screen 70, in addition to the buttons for displaying a simulation, such as a box 151 for specifying a flow mode, a "Read CAD" button 152, an "Display Gas" button 153, a "Clear Gas" button 154 and the like in the section of a menu 31.

In addition, the chamber 130, pipes 110, 134, 135, 140 and 142, the valves 111 to 120, MFCs 121, 122 and 123, exhaust pumps 136 and 137 and the like are provided in the CAD drawing displayed on the simulation screen 70. The pipes 110, 140 and 142 are gas supply lines, and the pipes 134 and 135 are exhaust lines.

If the "down arrow" of the box 151 for specifying a flow mode is pressed on the simulation screen 70, a pull-down menu is displayed on the box 151. The pull-down menu shows mode names such as an auto-flow mode, a pre-flow mode and a vacuum mode and a field for specifying a flow rate.

If the user selects, for example, the auto-flow mode, key-inputs (specifies) a flow rate and then presses the "Display Gas" button 153, the path search unit 19 searches for a path of each gas in the auto-flow mode.

In addition, other than specifying the operation mode, for example, the type of gas flowing into a pipe, an open/closed state of a valve installed in the pipe, and the operation condition including a flow rate of the gas may be key-input (or command-input) by the user.

<Operation of Searching for and Displaying Gas Path (Channel)>

The path search unit 19 reads a corresponding recipe from the recipe memory 13 according to gas flow information (operation mode) acquired by the information acquisition unit 10, finds pipes in a piping diagram based on the read recipe, and searches for a path (channel) in which each gas flows (Step S100).

In this case, the path search unit 19 detects attribute information associated with a connected figure (object part) among all the figures (object parts) read from the CAD drawing and temporarily maintains data of the connected figure (object part) in the memory 15. That is, a relationship between the figures such as pipes and valves on the drawing is detected (Step S101 of FIG. 5), and data thereof are maintained.

Subsequently, when a plurality of gases are used in the auto-flow mode according to the recipe read from the recipe memory 13, data on the figures such as pipes and valves starting from an inflow position (a start point of a gas) are read from the memory 15 for a gas which is read first, and a path is searched for by finding a relationship between the data (Step S102). Here, the path is represented as vectors, i.e., a connection of lines having directions, and an array of point information for animation are prepared in consideration of the directions of the lines, and stored in the memory 15.

Then, the path search unit 19 detects a direction of a gas flow at a branch point of the searched path (Step S103).

If the gas path arrives at the chamber 130 as a result of searching for a path while detecting the direction of the gas flow ("Yes" at Step S104), the path search unit 19 checks whether or not there is another type of gas simultaneously flowing through the gas path (Step S105). If there is another type of gas simultaneously flowing through the gas path ("Yes" at Step S105), the path search operation is performed again.

Then, based on the path search operation, all paths of the simultaneously flowing gases are searched. If it is determined that there is a gas path through which only one type of gas is flowing ("No" at Step S105), the path search unit 19 stores the searched paths of the gases in the memory 15 (Step S106).

Subsequently, it is determined whether or not the searched paths of gases collide with one another (Step S200).

In this case, the path search unit 19 first reads paths of respective gases from the memory 15 and searches for a gas path by sorting depths of the gases (Step S201). Here, the terms "depth" means a sequence (hierarchy) of connections between lines.

If the searched gas path does not collide with another gas path as a result of the path search ("No" at Step S202), the path search unit 19 provides a notification so as to put a color of the type of the searched gas on the path and to display an animation.

The simulation unit 20 simulates a gas flow by reading a color according to the classification of the gas and a character for animation from the gas definition information memory 14 and the database 11, putting the read color on the path and the character of the gas searched for by the path search unit 19, and displaying the character in an animation (Step S203).

On the other hand, if the searched gas path collides with another gas path as a result of the path search ("Yes" at Step S202), the path search unit 19 reads priorities of the collided gases from the gas definition information memory 14 and compares the priorities (Step S204).

A color of a gas having a higher priority is put on the paths (lines) in a section in which the gases collide with each other as a result of the comparison, and the simulation unit 20 is notified to display as many characters as the types of gases colored with original colors side by side along the paths in an animation so that the mixture of the respective gases may be confirmed with naked eyes.

According to the notification of the path search unit 19, the simulation unit 20 simulates a gas flow by reading a color and a character for animation according to the classification and the type of the gas from the gas definition information memory 14 and the database 11, putting the read color on the path and the character of the gas searched for by the path search unit 19, and displaying the character of each gas in an animation (Step S205).

Figure 6:
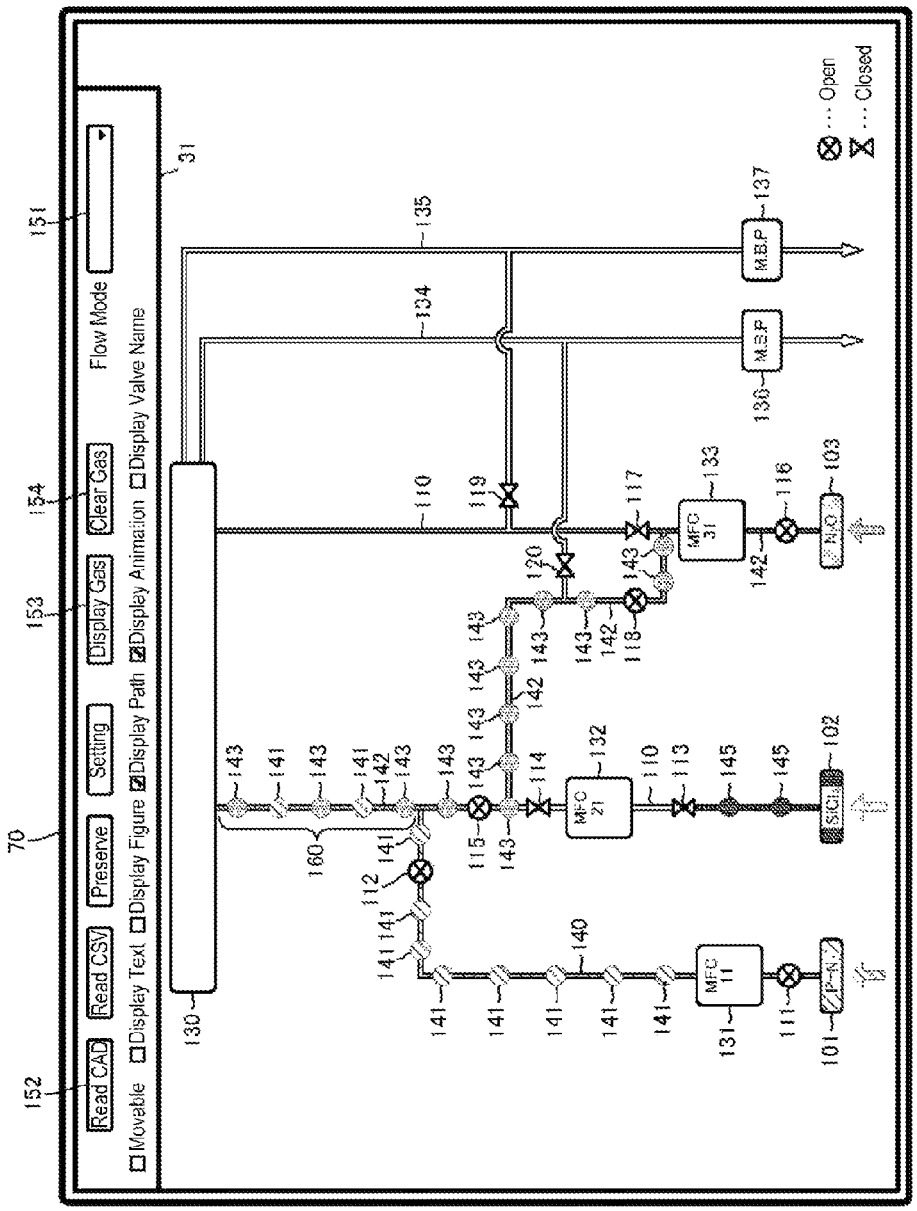
FIG. 6 is a diagram showing an example of a simulation screen.

A view of displaying the simulation is shown in FIG. 6.

As shown in FIG. 6, in the display of the simulation shown on the simulation screen 70, the valves 111 to 120 are respectively displayed in a state of "Open" or "Closed," and gases flowing through the paths from the start points 101 to 103 to the chamber 130 are colored.

In addition, for each gas, colored characters (the gas beads 141, 143 and 145) flicker at predetermined intervals to be displayed in an animation. In addition, the gas beads 141, 143 and 145 are arranged according to an array of point information for animation stored in the memory 15.

Also, when different gases are joined, a color of a gas having the highest priority is displayed as a color of the path (line) in the section where the gases are joined.

Further, in a section 160 where the different gases are joined, the gas beads 141 and 143 of gases respectively colored in original colors are displayed side by side on the path in an animation.

According to the first embodiment described above, by specifying the operation mode and a flow rate in the simulation screen 70, a gas path is searched for from a recipe according to a piping diagram (CAD drawing) of the gas and the operation mode, and the searched gas path is displayed as a character indicating a color defined according to the type of the gas and a direction of flow in an animation. Therefore, a simulation implementing a state of a gas flow diagram for the recipe can be conducted in a greater detail.

In addition, when different gases are joined, for example, since a state of a path of a harmful and dangerous gas is represented in its specific color by setting a priority of a highly harmful and dangerous gas to be high, a user can easily and visually identify a harmful and dangerous section in the path.

Also, in the section 160 where different gases are joined, since the gas beads 141 and 143 of the gases colored in their original colors are displayed in an animation side by side on the path, a user can easily know a mixture state and a flow of the gases in the joining section by viewing the gas beads 141 and 143 of different colors.

In addition, according to the recipe, it is possible to generate a gas flow path in which a combination of gases at a joining point of the gases generates a hazardous situation may be set by mistake. However, such situation can be easily and visually identified, since a path (line) is colored in amber if it includes a dangerous combination of the gases when they may accidentally be mixed and/or contact each other by the mistake made in setting a flow mode.

(Second Embodiment)

Figure 7:
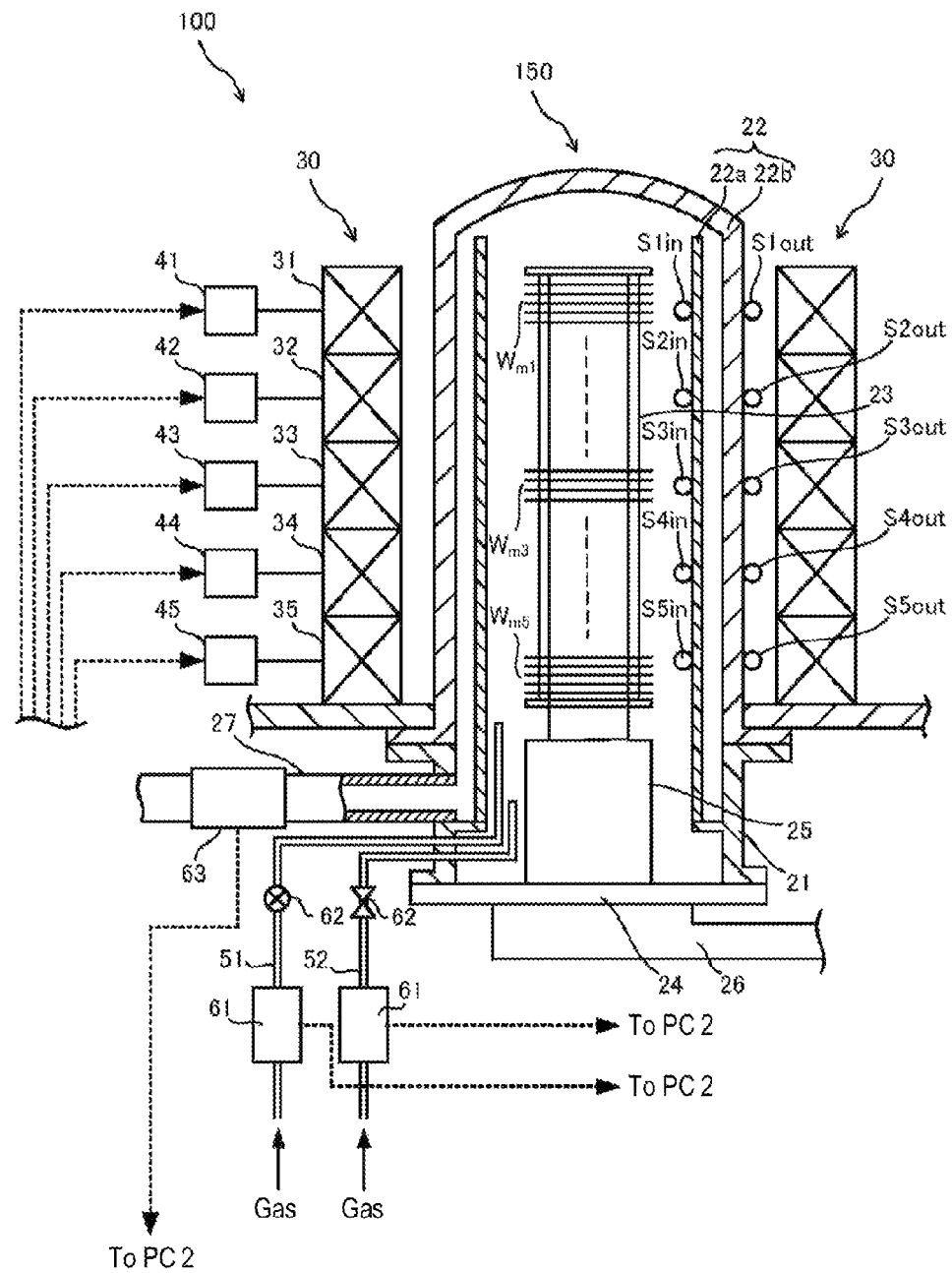
FIG. 7 is a diagram showing the configuration of a side surface of a heat processing apparatus, which is a semiconductor manufacturing apparatus related to a substrate processing apparatus of the present disclosure.
Figure 8:
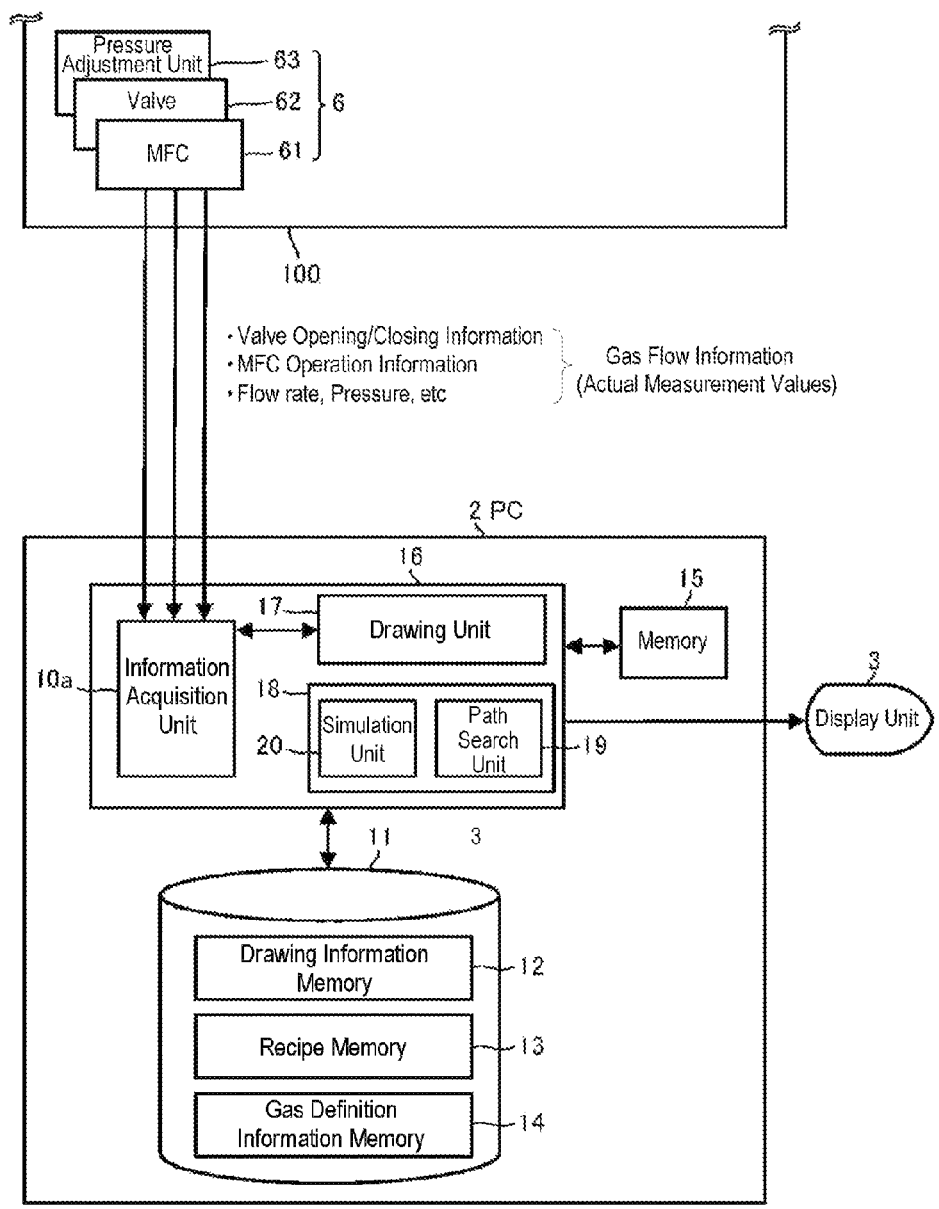
FIG. 8 is a diagram showing the configuration of a PC side of a simulation system of an embodiment.

Subsequently, a semiconductor manufacturing apparatus which is an embodiment of the substrate processing apparatus of the present disclosure will be described with reference to FIGS. 7 and 8. FIGS. 7 and 8 are views showing the configuration of a semiconductor manufacturing apparatus according to a second embodiment of the present disclosure.

As shown in FIGS. 7 and 8, a semiconductor manufacturing apparatus, e.g., a vertical heat processing apparatus 100 is configured by connecting a substrate processing unit 150 and a PC 2 as a simulation apparatus using a communication line or the like. The PC 2 simulates paths in which gases for processing a substrate flow through gas supply pipes 51 and 52 introduced into a reaction tube (process chamber) 22.

The substrate processing unit 150 is a processing apparatus for performing heat processing on a substrate for forming a semiconductor such as a semiconductor wafer. In the substrate processing unit 150, the substrate is accommodated in the reaction tube (process chamber) 22 and is processed.

The substrate processing unit 150 includes the reaction tube 22 of a double-tube structure having a cylindrical inner tube 22a made of quartz or the like and a cylindrical outer tube 22b arranged outside the inner tube 22a and having a top closed.

A cylindrical manifold 21 made of metal is arranged below the reaction tube 22. An opening, through which a semiconductor wafer or the like is carried in and out of the reaction tube 22, is provided below the manifold 21, and the opening is configured to be blocked with a cover 24.

The inner tube 22a is supported on the inside of the manifold 21 to be concentrically positioned inside the outer tube 22b. The outer tube 22b has a lower end tightly bonded to the upper end of the manifold 21.

A wafer boat 23, which is a substrate holding tool, is arranged inside the reaction tube 22. The wafer boat 23 is made of quartz or the like and is maintained through a thermos container (insulator) 25 on the cover 24. Plural sheets of semiconductor wafers (product wafers) W and plural sheets (five sheets in this embodiment) of monitor wafers Wm1 to Wm5 (only Wm1, Wm3 and Wm5 are shown in FIG. 7), on which the heat processing is performed, are arranged in the wafer boat 23.

The cover 24 is arranged on a boat elevator 26 which is configured to vertically move for carrying the wafer boat 23 in and out of the reaction tube 22. The cover 24 is elevated by the boat elevator 26 in order to close the opening at the lower end of the manifold 21, i.e., the lower opening of the reaction tube having the reaction tube 22 and the manifold 21, when the cover 24 is positioned at its upper limit position.

A heater 30, for example, includes resistance heating bodies and the like, and is installed around the reaction tube 22. The heater 30 includes five heaters 31 to 35 divided along the axis direction of the reaction tube 22, and the respective heaters 31 to 35 may independently control heat amount by power controllers 41 to 45. In the embodiment, as described above, a heating furnace includes the reaction tube 22, the manifold 21 and the heater 30.

Inner temperature sensors S1in to S5in include thermocouples or the like are installed on the inner wall of the inner tube 22a in correspondence to the heaters 31 to 35, respectively. In addition, outer temperature sensors S1out to S5out including thermocouples or the like are installed on the outer wall of the outer tube 22b in correspondence to the heaters 31 to 35, respectively.

It may be assumed that the inside of the inner tube 22a is divided into five zones in correspondence to the heaters 31 to 35. In addition, all the semiconductor wafers W stacked in the wafer boat 23 inside the reaction tube 22 are configured as one batch and heat-processed together (batch process).

In this embodiment, the monitor wafers Wm1 to Wm5 are respectively stacked in the five zones. However, generally, the number of zones may not correspond to the number of the monitor wafers Wm. For example, ten or three sheets of monitor wafers Wm may be disposed in the five zones. Although the number of zones does not correspond to the number of monitor wafers Wm, a setting temperature profile can be optimized.

A plurality of gas supply pipes are installed in the manifold 21 in order to supply gases inside the inner tube 22a, and two gas supply pipes 51 and 52 are shown in FIG. 7 for convenience. A flow rate adjustment unit, such as a mass flow controller 61 (hereinafter, referred to as "MFC 61") for controlling a flow rate of gas, a valve 62 and the like are installed at each of the gas supply pipes 51 and 52.

In addition, one end of an exhaust pipe 27 is coupled to the manifold 21 to exhaust gas from a gap between the inner tube 22a and the outer tube 22b, and the other end of the exhaust pipe 27 is coupled to a vacuum pump not shown. A pressure adjustment unit 63, for example, including a butterfly valve, a valve drive unit or the like, as a tool for controlling a pressure inside the reaction tube 22, is installed in the middle of the exhaust pipe 27. Sensors are installed in the respective devices (the MFCs 61, the valves 62, the pressure adjustment unit 63 and the like), and measure (detect) data, such as the type of flowing gas, opening/closing information of a valve, a flow rate and pressure of gas and the like (hereinafter, referred to as "gas flow information").

As shown in FIG. 8, the PC 2 is a control unit for monitoring and controlling operations of the substrate processing unit 150 and the like. An information acquisition unit 10a is provided in the PC 2. The information acquisition unit 10a acquires gas flow information (the type of flowing gas, opening/closing information of a valve, a flow rate and pressure of gas and the like) measured (detected) by the substrate processing unit 150 and transmits the gas flow information to the display control unit 18.

In the display control unit 18, the simulation unit 20 sets the gas flow information (the type of flowing gas, opening/closing information of a valve, a flow rate and pressure of gas and the like) transmitted from the information acquisition unit 10a as parameters of functional units, such as valves, pipes, MFCs and the like, of the CAD drawing and displays a state of an operating process (a gas flow, an open/closed state of a valve and the like) in an animation in the same way as the first embodiment. That is, the simulation is performed by displaying gas beads in an animation colored in a color of gas flowing through each path, which indicates a direction of the gas flow. Also, according to one embodiment, the direction of gas flow is specified from a flow rate of the gas. Alternatively, the direction of gas flow may be specified by reading the recipe.

That is, the PC 2 includes the information acquisition unit 10a for acquiring gas flow information (actually measured values) such opening/closing information of a valve, a flow rate and pressure of gas and the like actually measured from an external vertical heat processing apparatus 100, instead of the information acquisition unit 10 which is a user interface shown in the first embodiment, and the display control unit 18 for simulating the operation state of an operating process (gas flow) based on the gas flow information (actually measured values) acquired by the information acquisition unit 10a.

According to the semiconductor manufacturing apparatus of the embodiment as described above, since a color defined according to the type of gas is put on a gas path and a direction of gas flow is displayed in an animation of flickering the gas beads 141, 143 and 145, based on the gas piping diagram (CAD drawing) shown on the simulation screen 70 (see FIG. 6) and the gas flow information (actually measured values) acquired from the external heat processing apparatus 100, a simulation, which implements a state of an actual operating process in a greater detail, may be performed.

As described above, according to the above-described embodiments, a simulation, which implements a state of a gas flow diagram of the recipe or a state of an operating process in a greater detail, may be performed.

Preferred embodiments of the present disclosure have been described above with reference to the accompanying drawings, but the present disclosure is not limited to the embodiments. It should be understood that various changes and modifications are readily apparent to those skilled in the art within the scope of the technical spirit as set forth in claims, and those should also be covered by the technical scope of the present disclosure.

Although a semiconductor manufacturing apparatus is exemplified as a substrate processing apparatus in the above-described embodiments, the substrate processing apparatus additionally includes, for example, an apparatus for processing a substrate using a plurality of gases such as a display manufacturing apparatus or a solar cell manufacturing apparatus.

In addition, each of the constitutional components shown in the above-described embodiments may be implemented as a program installed in a storage, such as a hard disk device of a computer, or the function of the present disclosure may be implemented on a computer by storing the program in a computer-readable electronic medium and reading the program from the electronic medium by the computer.

The electronic medium includes, for example, a storage medium such as a CD-ROM, a flash memory, a removable medium and the like. In addition, the constitutional components may be distributed to be stored in different computers connected through a network, and each of the constitutional components may be implemented by communicating between the computers operating the functions.

According to the present disclosure, it is possible to provide a substrate processing apparatus, a simulation apparatus, a program and a simulation method, which can conduct a simulation, which implements a state of a gas flow diagram with respect to a recipe or a state of a currently operating process in more detail.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a substrate processing chamber configured to accommodate a substrate and process the substrate;
    a piping coupled to the substrate processing chamber to allow a gas for processing the substrate to be introduced therethrough; and
    a simulator comprising:
        a user interface through which an operation mode for processing the substrate is input by a user;
        a computer which includes:
            a recipe memory that stores a gas flow information indicating a path of the gas through the piping based on the operation mode for processing the substrate;
            a gas definition information memory that stores a priority and a color indication for the gas based on a type of the gas;
            an information acquisition part that acquires the gas flow information corresponding to the operation mode input by the user through the user interface from the recipe memory;
            a path determination part that determines a gas path in a piping diagram based on the gas flow information acquired by the information acquisition part; and
            a simulation part that reads the priority and the color indication of the gas from the gas definition information memory, and simulates a flow of the gas through the piping by putting the color indication on the gas path in the piping diagram determined by the path determination part, wherein when different types of gases are combined at a joining section of the gas path, the simulation part designates the joining section with a color indication with a higher priority; and
        a display that displays the simulation result of the simulation part.

2. The apparatus of claim 1, wherein the color indication is put on a character representing the flow of the gas, and the character is displayed on the gas path.

3. The apparatus of claim 2, wherein same number of characters with the number of types of joining gases are displayed in the joining section, and color indications of the respective joining gases are put on the characters.

4. The apparatus of claim 1, wherein a forbidden combination of gas types and a specific color indication corresponding to the forbidden combination are stored in the gas definition information memory, and if gases of the forbidden combination are joined in the joining section, the simulation part designates the joining section with the specific color indication.

5. The apparatus of claim 1, wherein a flow of the gas is simulated as a moving image.

6. The apparatus of claim 5, wherein the moving image is an animation representing a direction of the gas flow.

7. The apparatus of claim 1, wherein the path determination part searches for the gas path from a relationship between figures arranged on the piping diagram which is a previously set CAD drawing.

8. The apparatus of claim 1, wherein the substrate processing apparatus is a substrate processing apparatus configured to process any one of a semiconductor substrate, a flat panel substrate and a solar cell substrate.

9. A simulation apparatus configured to simulate a path in which a gas for processing a substrate flows through a piping introduced into a processing chamber configured to process the substrate, the simulation apparatus comprising:
    a user interface through which an operation mode for processing the substrate is input by a user;
    a computer which includes:
        a recipe memory that stores a gas flow information indicating a path of the gas through the piping based on the operation mode for processing the substrate;
        a gas definition information memory that stores a priority and a color indication for the gas based on a type of the gas;
        an information acquisition part that acquires the gas flow information corresponding to the operation mode input by the user through the user interface from the recipe memory;
        a path determination part that determines a gas path in a piping diagram based on the gas flow information acquired by the information acquisition part; and
        a simulation part that reads the priority and the color indication of the gas from the gas definition information memory, and simulates a flow of the gas through the piping by putting the color indication on the gas path in the piping diagram determined by the path determination part, wherein when different types of gases are combined at a joining section of the gas path, the simulation part designates the joining section with a color indication with a higher priority; and
    a display that displays the simulation result of the simulation part.

10. A non-transitory computer readable storage medium for storing computer program adapted to cause a computer to execute a process of simulating a path in which a gas for processing a substrate flows through a piping introduced into a processing chamber configured to process the substrate, the process comprising:
- receiving an operation mode for processing the substrate from a user via a user interface;
- acquiring a gas flow information corresponding to the operation mode from a recipe memory, the gas flow information indicating a path of the gas through the piping based on the operation mode for processing the substrate;
- determining a gas path in a piping diagram based on the acquired gas flow information;
- reading a priority and a color indication for the gas based on a type of the gas from a gas definition information memory; and
- simulating a flow of the gas through the piping by putting the color indication on the determined gas path in the piping diagram, wherein when different types of gases are combined at a joining section of the gas path, the joining section is designated with a higher priority.

11. A simulation method of simulating a path in which a gas for processing a substrate flows through a piping introduced into a substrate processing chamber configured to process the substrate, the method comprising:
- receiving an operation mode for processing the substrate from a user via a user interface;
- acquiring a gas flow information corresponding to the operation mode from a recipe memory, the gas flow information indicating a path of the gas through the piping based on the operation mode for processing the substrate;
- determining a gas path in a piping diagram based on the acquired gas flow information;
- reading a priority and a color indication for the gas based on a type of the gas from a gas definition information memory; and
- simulating a flow of the gas through the piping by putting the color indication on the determined gas path in the piping diagram, wherein when different types of gases are combined at a joining section of the gas path, the joining section is designated with a color indication with a higher priority.

* * * * *